United States Patent [19]
Boerstler

[11] Patent Number: 5,892,409
[45] Date of Patent: Apr. 6, 1999

[54] CMOS PROCESS COMPENSATION CIRCUIT

[75] Inventor: David William Boerstler, Round Rock, Tex.

[73] Assignee: International Business Machines Corporation, Armonk, N.Y.

[21] Appl. No.: 901,298

[22] Filed: Jul. 28, 1997

[51] Int. Cl.$^6$ .............................. H03B 5/04; H03B 5/24; H03L 1/00; H03K 3/011
[52] U.S. Cl. ...................... 331/57; 331/175; 331/177 R; 326/34; 327/543
[58] Field of Search ......................... 331/57, 175, 177 R, 331/185, 186; 326/30, 34; 327/262, 538, 543

[56] References Cited

U.S. PATENT DOCUMENTS

| | | | |
|---|---|---|---|
| 3,657,575 | 4/1972 | Taniguchi et al. | |
| 3,970,875 | 7/1976 | Leehan | 327/543 |
| 4,016,434 | 4/1977 | DeFilippi | 327/543 |
| 4,049,980 | 9/1977 | Maitland | |
| 4,242,604 | 12/1980 | Smith | |
| 4,380,707 | 4/1983 | Crisp | |
| 4,716,307 | 12/1987 | Aoyama | 327/543 |
| 4,723,108 | 2/1988 | Murphy et al. | |
| 4,918,334 | 4/1990 | Correale, Jr. et al. | |
| 4,975,599 | 12/1990 | Petrovick, Jr. et al. | |
| 5,061,907 | 10/1991 | Rasmussen | 331/57 |
| 5,111,081 | 5/1992 | Atallah | |
| 5,149,994 | 9/1992 | Neu | |
| 5,157,285 | 10/1992 | Allen | |
| 5,164,621 | 11/1992 | Miyamoto | 327/262 |
| 5,268,872 | 12/1993 | Fujii et al. | |
| 5,361,006 | 11/1994 | Cooperman et al. | |
| 5,467,052 | 11/1995 | Tsukada | |
| 5,760,657 | 6/1998 | Johnson | 331/175 |

OTHER PUBLICATIONS

Shih–Wei Sun and Paul G.Y. Tsui, "Limitation of CMOS Supply–Voltage Scaling by MOSFET Threshold–Voltage Variation", IEEE Journal of Solid State Circuits, vol. 30, No. 8, Aug. 1995, pp. 947–949.

Dennis T. Cox et al., "VLSI Performance Compensation for Off–Chip Drivers and Clock Generation", IEEE Custom Integrated Circuits Conference, 1989, pp. 14.3.1–14.3.4.

Primary Examiner—David Mis
Attorney, Agent, or Firm—Casimer K. Salys; Alan L. Carlson; Andrew J. Dillon

[57] ABSTRACT

A CMOS compensation circuit receives compensation signals and provides a proportional compensation signal to an application circuit. The compensation circuit is implemented having a load for receiving at least one compensation signal. A device mirroring the load provides the application circuit with a compensation signal proportional to the received compensation signals. In a preferred embodiment, the compensation circuit provides a current controlled oscillator a compensation current to modify the bias of the oscillator. In a preferred embodiment, the compensation current is supplied by a fabrication variation monitor. The fabrication variation monitor supplies a signal to compensate for variations in the fabrication process, such as threshold voltage and effective length.

15 Claims, 2 Drawing Sheets

CMOS PROCESS COMPENSATION CIRCUIT

CROSS REFERENCE TO RELATED APPLICATION

The present application is related to copending U.S. application Ser. No. 08/901,297, entitled "Process Variation Monitor for Integrated Circuits" filed of an even date herewith and assigned to the assignee hereon named. The content of the copending application is hereby incorporated herein by reference thereto.

BACKGROUND OF THE INVENTION

1. Technical Field

The present invention relates in general to integrated circuits and in particular to a compensation circuit for use in integrated circuits. Still more particularly, the present invention relates to a compensation circuit which is driven by fabrication process variation monitors.

2. Description of the Related Art

The primary challenge in designing integrated circuits is to control circuit parameters such as delay in view of variations in the semiconductor fabrication process, supply voltage, and temperature. All of the above parameters and variables generally exhibit complex relationships among each other. Attaining homogeneous transistor operating parameters, such as threshold voltage and transconductance, within an integrated circuit is one of the most important, yet most difficult objectives for precision analog circuits. Transistor threshold voltage is also very critical in propagation speed for high speed low voltage digital circuits.

A metallic oxide semiconductor field effect transistor (MOSFET) has two regions in a silicon substrate, namely a source and drain region, which are disposed at a certain distance from each other. A MOS transistor also has an insulated gate electrode which is disposed above the silicon substrate, created by an insulating film such as a metal oxide film. A current flow from the drain to the source of a MOS transistor is controlled by a voltage supplied to the insulated gate electrode.

The voltage at the gate of a transistor which determines the boundary between the OFF state and the ON state in the drain current, is called the threshold voltage ($V_{TH}$). The threshold voltage of a MOS transistor is sensitive to fabrication parameters. The threshold voltage varies according to the thickness and nature of the insulating film utilized at the gate.

The length and width of the source, drain and gate regions determine many of the operating parameters of a MOS transistor. Currently, MOS transistors have dimensions which measure less than a micron. During the fabrication of a MOS transistor, doped layers are deposited or etched on the substrate where the source and drain exist. Etching and implanting are performed utilizing a "mask" which dictates the location at which the deposition or removal of material takes place on a silicon wafer.

During the implanting process, diffraction may occur around the edge of the aperture in the mask. Diffraction causes undercutting of the mask. In the implanting of a gate, undercutting will increase the desired dimension of the gate and decrease the adjacent region. Random fluctuations in the gate dimensions commonly occur in different geographic regions of semi-conductor chips. Underexposure can lead to smaller than desired lengths. Ion implanting and ion "drive-in" are the principle cause of smaller than expected gate lengths. At the edge of the wafer, process tolerances are more difficult to control than at the center. Also, heating in the fabrication process, causes migration of atoms at the boundary of the implantation or etch into adjacent regions. Heating also alters the desired dimensions. Further, in the etching process, acid can spread under a mask aperture edge and remove material. It is well known in the art that many fabrication process steps can change the desired dimensions of semiconductor regions. Hence, the desired length (L) and width (W) of the source, drain, and gate can be described as the actual or effective length ($L_{eff}$) and the effective width ($W_{eff}$). It is important to note that depending on whether the mask is a negative for etching or a positive for deposition, $L_{eff}$ can be increased or decreased. Underexposure can increase and decrease $L_{eff}$. Likewise, overexposure can increase and decrease $L_{eff}$.

Other process variation leading to diverse MOSFET parameters are doping concentration and mobility. Semiconductor process variations particularly $L_{eff}$ and $W_{eff}$ greatly effect the threshold voltages of MOS transistors. In many circuits, a slight shift or deviation in critical threshold voltages produces unacceptable signal processing results.

Techniques for stabilization of transistor threshold voltages have received a substantial amount of attention in the area of precision circuits. Examples of precision circuits, or circuits which are very sensitive to process variations include voltage controlled oscillators and off-chip drivers.

Known compensation techniques for circuits requiring accurate threshold voltages are extensive and diverse. Threshold voltage compensation techniques are typically external. It is very common in the prior art to compensate for threshold voltage variations utilizing indirect methods. Indirect methods do not specifically sense the threshold voltage, or utilize detection of the source of the problem, but compensate by sensing the adverse effects which the threshold voltage variation has created. Generally, each threshold voltage compensation technique implemented is driven by the application of the circuit.

Process variations can also cause propagation aberrations in high speed low voltage digital circuits, particularly in off-chip drivers. Process variations can cause propagation times which range from one half to one and one half of the design target value. Signals arriving too early and signals arriving too late can cause execution difficulties. Timing issues due to process variations are prevalent in on-chip as well as chip-to-chip designs. To control the propagation of high speed low voltage digital circuits, it is necessary to reduce the sensitivity of the circuits to process variations. Propagation compensation circuits have only a limited ability to increased propagation speed.

Similarly, timing problems associated with process variations and threshold voltage are encountered in analog circuits. Control circuits, such as oscillator circuits are particularly sensitive to process variations. A common technique employed in most analog systems today is to take advantage of good matching between two identical transistors. The two transistors are placed proximate to each other on a substrate and identically biased. This method is very common in current mirrors. However, when operating parameters for a large number of transistors are critical, it becomes impossible to take advantage of matching by proximity.

Current calibration techniques are presently used to compensate control circuits. Some current calibration techniques require bias transistors which are calibrated against a fixed reference then utilized to bias an analog cell. The disadvantage of such schemes is that frequent calibration is necessary. Most current calibration designs can not perform the required calibration during operation and must go "off-line" to calibrate. Techniques to solve the latter problem have been developed by utilizing additional calibration cells. However, the need to switch the bias currents and supply control signals to multiple circuits adds complexity and requires chip area. Current calibration techniques can effectively compensate for threshold voltage, but this technique is unduly complex.

Other known compensation systems use a digital memory and a digital to analog converter to generate reference currents. The reference currents are then utilized to compensate for divergent parameters such as threshold voltage. Cross coupling techniques are also popular for minimizing the input offsets due to threshold voltage variations in analog circuits such as high gain operational amplifiers. Compensation circuits may also utilize comparators to improve matching of threshold voltages.

Tighter process tolerances can be adopted to improve performance or reduce variability, but this substantially increases the cost of the product. Another commonly used technique is extensive testing and selection to isolate acceptable devices. This also increases the cost of the product due to the testing effort and the corresponding lower yield.

A typical threshold voltage compensation circuit compensates for variations utilizing resistive elements and comparators. Known compensation circuits are either based upon devices which are correlated and unable to respond to absolute process variations or they are based upon external references or phenomena. Known compensation circuits adjust for threshold voltage variations by compensating circuit response. Hence, present threshold voltage compensation techniques are deficient because they do not monitor actual device parameters.

To compensate for process induced device variations, complex arrangements have hitherto been required. Hence, a need exists for a simple effective and efficient process variation detector or monitor to compensate for fabrication variations.

SUMMARY OF THE INVENTION

It is therefore one object of the present invention to provide a compensation circuit for use in integrated circuits.

It is another object of the present invention to provide a compensation circuit for use in integrated circuits which accepts fabrication process variation signals.

It is yet another object of the present invention to provide a compensation circuit for use in integrated circuits which is responsive to multiple compensation inputs.

The foregoing objects are achieved as is now described. A CMOS compensation circuit receives compensation signals and provides a proportional compensation signal to an application circuit. The compensation circuit is implemented having a load for receiving at least one compensation signal. A device mirroring the load then provides the application circuit with a compensation signal proportional to the received compensation signals. In a preferred embodiment, the compensation circuit provides a current controlled oscillator a compensation current which modifies the bias of the oscillator. In a preferred embodiment, the compensation current is supplied by a fabrication variation monitor. The fabrication variation monitor supplies a signal to compensate for variations in the fabrication process, such as, threshold voltage and effective length.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
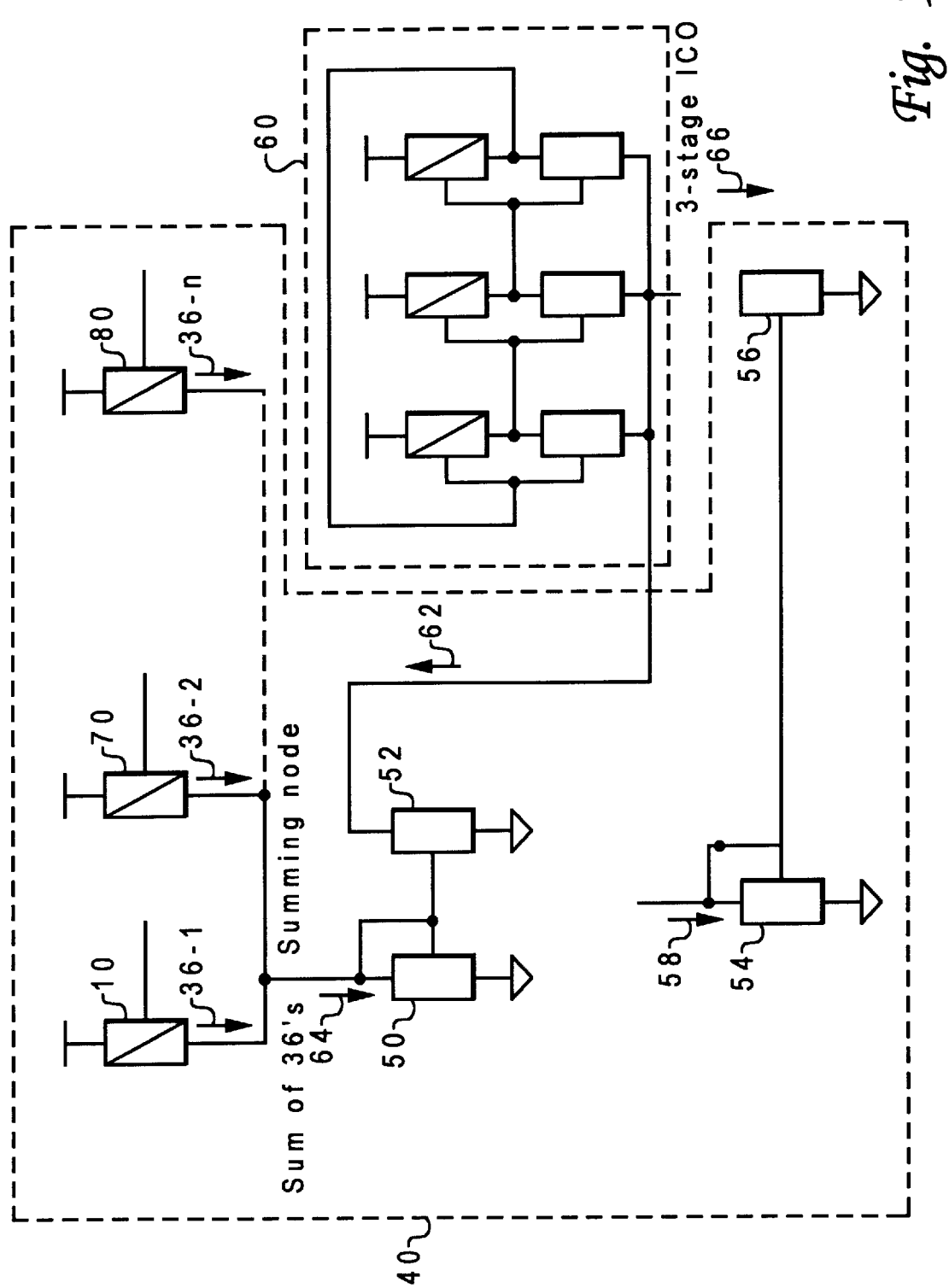
FIG. 1 illustrates a CMOS process compensation circuit, compensating an oscillator in accordance with the present invention.
Figure 2:
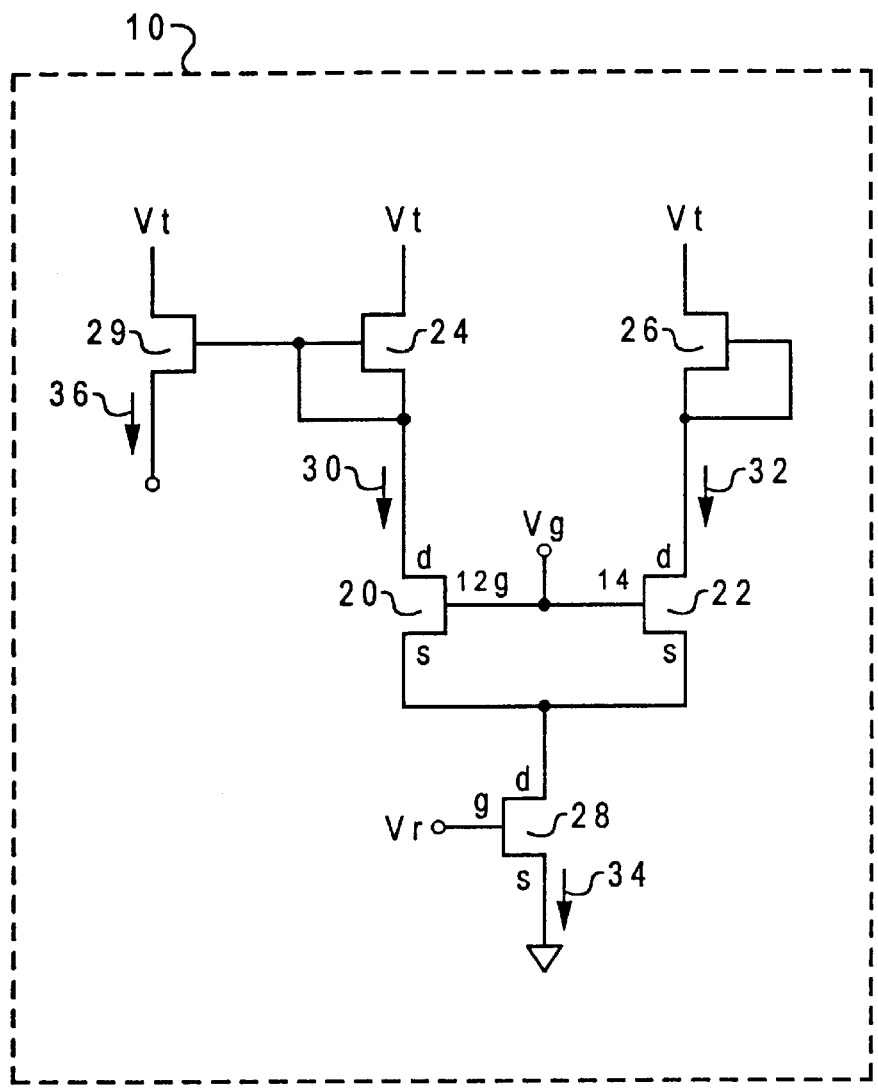
FIG. 2 depicts a typical fabrication process variation monitor which can effectively supply the CMOS process compensation circuit in accordance with the present invention.

With reference now to the figures and in particular with reference to FIG. 1, a CMOS process compensation circuit 40 is depicted. In a preferred embodiment, a plurality of fabrication variation monitors 10, 70 and 80, each supply a portion of current to load 50. Each fabrication variation monitor 10, 70 and 80 can provide compensation for individual variations as a result of the fabrication process. However, a single fabrication variation monitor may be used to provide compensation. Referring briefly to FIG. 2, a fabrication variation monitor 10 is shown. Fabrication variation monitor 10 can monitor threshold voltage, transconductance, mobility and other fabrication variations. Fabrication variation monitors 70 and 80 may be identical to fabrication monitor 10 or could be any current compensation generator which can provide a compensation signal or feedback as a function of any variable.

Referring again to FIG. 1, current 64 is provided to load 50. Load 50 is mirrored by current mirror 52. In a preferred embodiment, a current controlled oscillator 60 is the application circuit compensated by compensation circuit 40. In an alternate embodiment, any circuit in which altering the current bias changes the operating attributes, could be compensated by CMOS process compensation circuit 40. Current from fabrication variation monitor 10, 70 and 80 can be weighted by additional current mirroring or other techniques for weighing the compensation currents. Current controlled oscillator 60 is biased by current source 56. Current source 56 mirrors reference device 54 which conducts a reference current 58. In a preferred embodiment, bias current 66 is an order of magnitude larger than compensation current 62 which mirrors the sum of compensation currents.

In summary, compensation currents which are related to threshold voltage offsets and other phenomena are supplied to a load 50. The current through load 50 is mirrored by current mirror 52. Current controlled oscillator 60 is biased by current source 56. Current source 56 mirrors reference device 54. Current mirror 52 can be complementary or deduct from bias current 66 of current controlled oscillator 60 such that compensation current 62 changes the bias point of the current controlled oscillator 60 to compensate for fabrication process variations.

FIG. 2 depicts fabrication process variation monitor 10. A preferred embodiment of the fabrication process variation monitor 10 is used in an integrated circuit to monitor the threshold voltage ($V_{th}$) of a transistor. In a preferred embodiment, transistor 22 is a conventional N-FET transistor, however, an alternate embodiment could be a partially implanted transistor. Transistor 20 is a N-FET which does not have a p-well implant. In an alternate embodiment transistor 20 could be a partially implanted transistor. A partially implanted transistor would have a lower threshold voltage than a conventional transistor on the same substrate.

The sum of current 30 and current 32 is equal to current 34, and the magnitude of each current is dependent on $V_g$ which is applied to the gates 12 and 14 of transistors 20 and 22. The sum of the currents through transistors 20 and 22 is equal to the current sourced by transistor 28. Transistor 22, having a p-well implant, or a partial p-well implant, manifest process variations in parameters such as threshold voltage, transconductance, mobility, and temperature sensitivity. As fabrication variations occur in transistor 22, current 30 either increases or decreases, responsive to the fabrication variations. Transistor 29 is a current mirror having its gate connected to the gate of transistor 24 such that current 30 is scaled and proportional to current 36. The monitor circuit provides a current 36 which is proportional to the square of the threshold voltage of transistor 22. In a preferred embodiment, the relationship of the threshold voltage of a transistor 22 to current 36 is used to compensate current control oscillator 60 of FIG. 1. Current controlled oscillator 60 is sensitive to transconductance, threshold voltage, mobility, or other parameters, due to the fabrication process offset or deviation which effect these parameters. For a more in depth description of fabrication process monitor 10 refer to the cross referenced copending United States application entitled "Process Variation Monitor for Integrated Circuits" filed of an even date herewith. The content of the copending application is hereby incorporated by reference.

While the invention has been particularly shown and described with reference to a preferred embodiment, it will be understood by those skilled in the art that various changes in form and detail may be made therein without departing from the spirit and scope of the invention.

What is claimed is:

1. A compensation circuit for adjusting the output response of an application circuit, said compensation circuit comprising:

a monitor circuit producing a reference signal proportional to at least one parameter variations;

a load circuit for receiving said reference signal;

a bias circuit for providing a bias to an application circuit; and a mirror circuit coupled to said load circuit, said mirror circuit for providing compensation to said bias provided to said application circuit in response to said reference signal, such that said mirror circuit modifies said bias provided by said bias circuit to said application circuit, wherein an output response of said application circuit is compensated to adjust for said at least one parameter variation.

2. The compensation circuit according to claim 1, wherein said monitor circuit utilizes a known fabrication relationship between a first transistor and a second transistor, wherein said first transistor manifests operationally divergent characteristics from said second transistor to produce said reference signal.

3. The compensation circuit according to claim 1, wherein said application circuit is biased with a current.

4. The compensation circuit according to claim 1, wherein said compensation signal is a current.

5. The compensation circuit according to claim 1, wherein said reference signal is comprised of the sum of multiple reference signals.

6. The compensation circuit according to claim 1, wherein said application circuit is a current controlled oscillator.

7. A compensation circuit for receiving a plurality of compensation signals, said compensation circuit for supplying a single compensation signal to an application circuit, said compensation circuit comprising:

a load for receiving said plurality of compensation signals; and a mirroring device coupled to said application circuit and said load device, said mirroring device supplying said application circuit with a compensation signal proportional to said plurality of compensation signals received by said load, wherein said application circuit is compensated by said plurality of compensation signals.

8. The compensation circuit according to claim 7, wherein said compensation signal is a current.

9. The compensation circuit according to claim 7, wherein said application circuit is biased by a current and said plurality of compensation signals modifies said bias of said application circuit.

10. The compensation circuit according to claim 7, wherein each of said compensation signals are individually weighted prior to being received by said load.

11. The compensation circuit according to claim 7, wherein said application circuit is a current controlled oscillator.

12. The compensation circuit according to claim 7, wherein said plurality of compensation signals are provided by a fabrication process variation monitor.

13. A compensated oscillator comprising:

an oscillator;

a current source biasing said oscillator;

a compensation signal generator producing at least one compensation signal;

a load device receiving said at least one compensation signal; and a current mirror, responsive to said load device, said current mirror for providing compensation to said oscillator, wherein said oscillator is compensated by said compensation signal generator.

14. The compensated oscillator according to claim 13, wherein said at least one compensation signal is a current.

15. The compensated oscillator according to claim 13, wherein said compensated oscillator is a current controlled oscillator.

\* \* \* \* \*